(12) United States Patent
Bae

(10) Patent No.: US 9,846,335 B2
(45) Date of Patent: Dec. 19, 2017

(54) DISPLAY APPARATUS

(71) Applicant: Samsung Display Co., Ltd., Yongin-Si, Gyeonggi-Do (KR)

(72) Inventor: Hyunchul Bae, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 56 days.

(21) Appl. No.: 15/140,631

(22) Filed: Apr. 28, 2016

(65) Prior Publication Data

US 2017/0108721 A1 Apr. 20, 2017

(30) Foreign Application Priority Data

Oct. 15, 2015 (KR) ........................ 10-2015-0144135

(51) Int. Cl.
| | | |
|---|---|---|
| G02F 1/1339 | (2006.01) | |
| F21V 8/00 | (2006.01) | |
| H01L 33/44 | (2010.01) | |
| H01L 33/48 | (2010.01) | |
| H01L 33/50 | (2010.01) | |
| H01L 33/54 | (2010.01) | |
| H01L 33/62 | (2010.01) | |

(Continued)

(52) U.S. Cl.
CPC ......... *G02F 1/1339* (2013.01); *G02B 6/0083* (2013.01); *G02B 6/0091* (2013.01); *G02F 1/1333* (2013.01); *G02F 1/13394* (2013.01); *H01L 33/44* (2013.01); *H01L 33/486* (2013.01); *H01L 33/505* (2013.01); *H01L 33/54* (2013.01); *H01L 33/62* (2013.01); *G02F 1/133512* (2013.01); *G02F 1/133528* (2013.01)

(58) Field of Classification Search
CPC .. G02F 1/1339; G02F 1/1333; G02F 1/13394; G02F 1/133512; G02F 1/133528; H01L 33/62; H01L 33/54; H01L 33/44; H01L 33/486; H01L 33/505; G02B 6/0091; G02B 6/0083

See application file for complete search history.

(56) References Cited

U.S. PATENT DOCUMENTS

| | | | |
|---|---|---|---|
| 2014/0055709 A1 | 2/2014 | Yu et al. | |
| 2015/0146112 A1* | 5/2015 | Gotou | ............... G02F 1/133308 |
| | | | 348/794 |

FOREIGN PATENT DOCUMENTS

| | | |
|---|---|---|
| KR | 1020030088645 A | 11/2003 |
| KR | 10-1345279 B1 | 12/2013 |

(Continued)

*Primary Examiner* — Donald Raleigh
*Assistant Examiner* — Kevin Quarterman
(74) *Attorney, Agent, or Firm* — Cantor Colburn LLP

(57) ABSTRACT

A display apparatus includes a first base substrate including an effective area and a pad area adjacent to the effective area, a second base substrate on the first base substrate to overlap the effective area and expose the pad area of the first base substrate at a side surface of the second base substrate, a spacer on the exposed pad area of the first base substrate and facing the side surface of the second base substrate, the spacer being spaced apart from the side surface of the second base substrate, a sealant between the spacer and the side surface of the second base substrate to contact both the spacer and the side surface of the second base substrate, and an optical film on the second base substrate, the optical film extended further than the side surface of the second base substrate to overlap the sealant and the spacer.

20 Claims, 9 Drawing Sheets

(51) Int. Cl.
*G02F 1/1333* (2006.01)
*G02F 1/1335* (2006.01)

(56) References Cited

FOREIGN PATENT DOCUMENTS

| KR | 20150052926 A | 5/2015 |
| KR | 1020150072534 A | 6/2015 |

* cited by examiner

DISPLAY APPARATUS

This application claims priority under 35 U.S.C. §119 of Korean Patent Application No. 10-2015-0144135, filed on Oct. 15, 2015, the entire contents of which are hereby incorporated by reference.

BACKGROUND (1) Field

The invention disclosed herein relates to a display apparatus.

(2) Description of the Related Art

Examples of flat panel display apparatuses include a liquid crystal display device ("LCD"), a plasma display device ("PDP"), a field emission display device ("FED"), a light emitting diode display device and an organic light emitting diode display device.

The LCD device among the flat panel display apparatuses is establishing a firm foothold in the market due to advantages such as development in mass production technology, ease of using a driving unit, relatively low power consumption, thin thickness and high-definition realization, and large screen realization and applications thereof are expanding.

Research and development for providing display device products having various designs to users with continuous development of the technology of the flat panel display apparatus are being magnified.

SUMMARY

One or more exemplary embodiment of the invention provides a display apparatus having a slim design.

One or more exemplary embodiment of the invention provides a display apparatus that has improved display quality due to protection of a display panel therein.

An exemplary embodiment of the invention provides a display apparatus including: a first base substrate including an effective area in which an image is displayed, and a pad area which is adjacent to a side of the effective area and through which a control signal is provided to the effective area; a second base substrate disposed on the first base substrate to overlap the effective area and expose the pad area of the first base substrate; a spacer disposed on the exposed pad area of the first base substrate and facing a side surface of the second base substrate, the spacer being spaced apart from the side surface of the second base substrate; a sealant disposed between the spacer on the exposed pad area of the first base substrate and the side surface of the second base substrate to contact both the spacer and the side surface of the second base substrate; and an optical film disposed on the second base substrate, the sealant, and the spacer.

In an exemplary embodiment, in a top plan view, the spacer may have a planar area greater than that of the pad area.

In an exemplary embodiment, the display apparatuses may further include a colored layer overlapping the effective area, the colored layer being disposed on a portion of a bottom surface of the second base substrate facing the first base substrate. The colored layer may include a material having a first color.

In an exemplary embodiment, the spacer may have the first color.

In an exemplary embodiment, in the top plan view, the spacer may be lengthwise disposed along the side surface of the second base substrate.

In an exemplary embodiment, the sealant may include a material having the first color.

In an exemplary embodiment, the display apparatuses may further include signal lines through which the control signal is transmitted into the effective area, the signal lines including a line portion disposed on the effective area, and a pad portion disposed on the pad area. The spacer may be disposed on the pad portion of the signal lines.

In an exemplary embodiment, the display apparatuses may further include: a flexible circuit film which is connected to the pad portion of the signal lines, is disposed in the pad area of the first base substrate and which provides the control signal to the pad portion; a driving chip which is mounted on the flexible circuit film and provides the control signal to the flexible circuit film; and a printed circuit board which is connected to the flexible circuit film and generates the control signal. The spacer may be disposed on the flexible circuit film in the pad area of the first base substrate.

In an exemplary embodiment, the display apparatuses may further include a backlight unit which is disposed under the first base substrate and provides light to the first base substrate. The backlight unit may include: a bottom chassis defining a bottom portion thereof facing the first base substrate, the bottom portion extended to define a bent portion thereof which defines a sidewall of the bottom chassis; a mold frame defining a first frame portion thereof facing the bottom portion of the bottom chassis to overlap the sidewall of the bottom chassis, the first frame portion extended to define a bent portion thereof which defines a second frame portion of the mold frame, the second frame portion facing the sidewall of the bottom chassis; a light source unit which is in the bottom chassis and generates the light; and a light guide plate disposed between the bottom chassis and the mold frame.

In an exemplary embodiment, a plane of the first base substrate may be defined by a first direction and a second direction which crosses the first direction, and a thickness direction of the first base substrate is defined in a third direction crossing both the first and second directions. The bottom portion of the bottom chassis may define: a first flat portion thereof spaced a first distance from the first base substrate in the third direction; a second flat portion thereof spaced a second distance from the first base substrate in the third direction greater than the first distance in the third direction; and a connection portion thereof which connects the first flat portion to the second flat portion, the connection portion facing the sidewall of the bottom chassis.

In an exemplary embodiment, the light source unit may include: a circuit board disposed between the sidewall and the connection portion and on the second flat portion; and a light source which is mounted on the circuit board and generates and emits the light to the light guide plate.

In an exemplary embodiment, the flexible circuit film disposed in the pad area of the first base substrate may be extended bent from the first base substrate to face the second frame portion of the mold frame and the bottom portion of the bottom chassis.

In an exemplary embodiment, the printed circuit board connected to the flexible circuit film extended bent from the first base substrate may be disposed under the bottom chassis to overlap the first flat portion.

In an exemplary embodiment, the display apparatus may further include a protection member which is disposed outside the flexible circuit film extended bent from the first base substrate and defining: a first protection portion facing the sidewall of the bottom chassis with the flexible circuit film therebetween; the first protection portion extended at a first end thereof to define a bent portion thereof which defines a second protection portion of the protection member on which the spacer is supported; the first protection portion extended from an opposing second end thereof to define a bent portion thereof which defines a third protection portion facing the bottom portion of the bottom chassis with the printed circuit board therebetween; and the third protection portion extended to define a bent portion thereof which defines a fourth protection portion bent facing the connection portion of the bottom chassis with the printed circuit board therebetween.

In an exemplary embodiment, the optical film may define: a first film portion overlapping the second base substrate; and a second film portion of which at least a portion overlaps the sealant and the spacer.

In an exemplary embodiment, the first film portion overlapping the second base substrate may extend further than the second base substrate to define the second film portion.

In an exemplary embodiment, the first film portion and the second film portion may be separate members from each other, and in a plan view, the second film portion may have the same planar area as a total of that of the spacer and the sealant.

In an exemplary embodiment, the first film portion and the second film portion may be separate members from each other, the first film portion may overlap a portion of the effective area, and the second film portion may overlap a remaining portion of the effective area not overlapped by the first film portion. In a top plan view, the second film portion may have a planar area greater than a total of that of the spacer and the sealant.

In an exemplary embodiment of the invention, a display apparatus includes: a display area in which an image is displayed, and a non-display area in which the image is not displayed, a pad area which is adjacent to a first edge of the effective area and through which a control signal is provided to the effective area, and a sub pad area which is adjacent to a second edge of the effective area adjacent to the first edge thereof and through which the control signal is provided to the effective area; a second base substrate disposed on the first base substrate to overlap the effective area and respectively expose the pad area and the sub pad area of the first base substrate a colored layer overlapping the non-display area and disposed on a bottom surface of the second base substrate, the colored layer including a material having a first color; a spacer disposed on the exposed pad area of the first base substrate and spaced apart from the first side surface of the second base substrate, the spacer having the first color; a sub spacer disposed on the exposed sub pad area of the first base substrate and spaced apart from the second side surface of the second base substrate, the sub spacer having the first color; a sealant disposed between the spacer on the exposed pad area of the first base substrate and the first side surface of the second base substrate, the sealant having the first color; a sub sealant disposed between the sub spacer on the exposed sub pad area of the first base substrate and the second side surface of the second base substrate, the sub sealant having the first color; and an optical film disposed on the second base substrate, the sealant, the sub sealant, the spacer, and the sub spacer.

In an exemplary embodiment, in a top plan view, the spacer may have a planar area greater than that of the pad area, and the sub spacer may have a planar area the same as that of the sub pad area.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
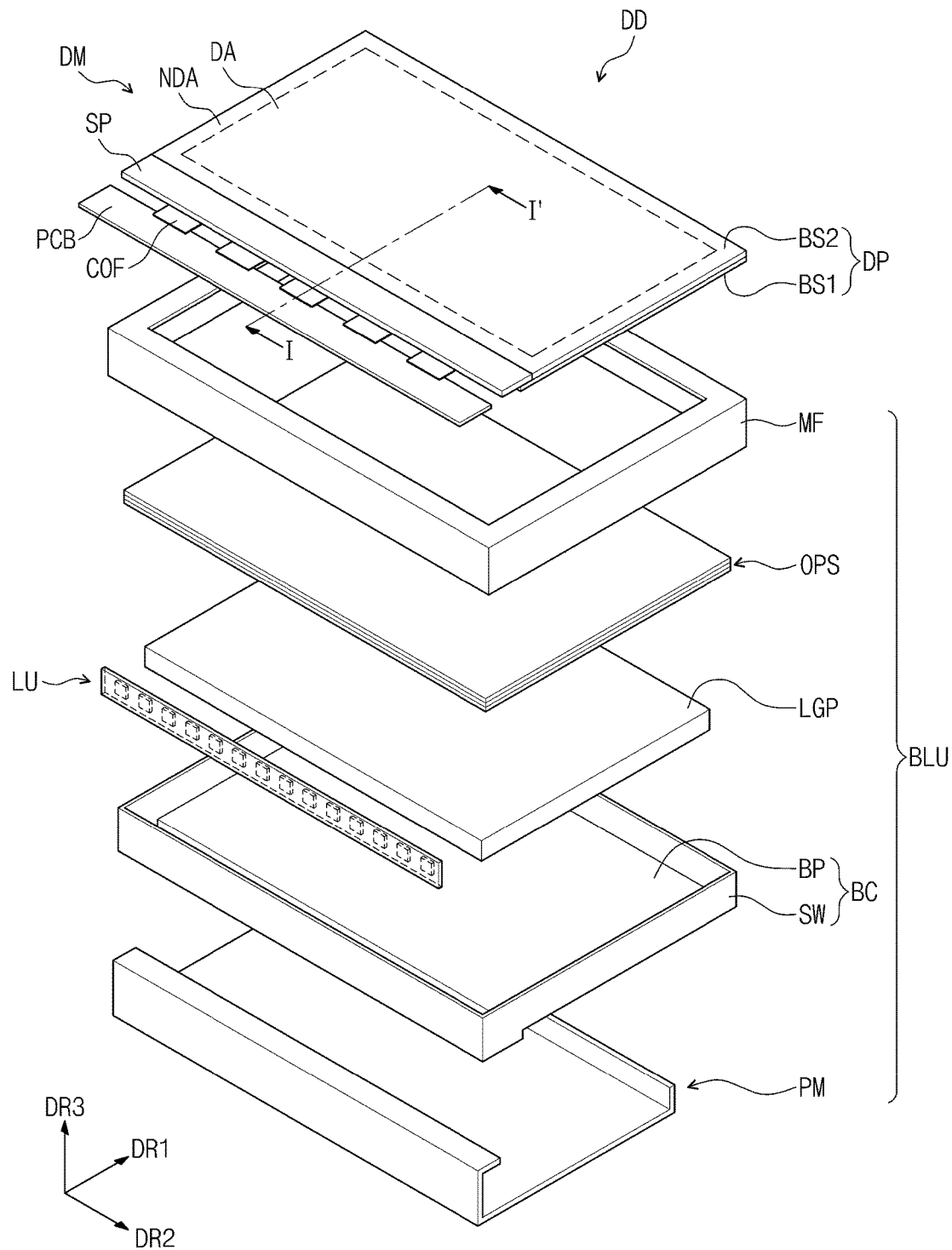
FIG. 1 is an exploded perspective view of an exemplary embodiment of a display apparatus according to the invention.

Since the present disclosure may have diverse modified embodiments, embodiments are illustrated in the drawings and are described in the detailed description of the invention. However, such disclosure does not limit the invention within specific embodiments and it should be understood that the present disclosure covers all the modifications, equivalents, and replacements within the idea and technical scope of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present.

Like reference numerals refer to like elements throughout. In the drawings, the dimensions and size of each structure are exaggerated, omitted, or schematically illustrated for convenience in description and clarity. It will be understood that although the terms of first and second are used herein to describe various elements, these elements should not be limited by these terms. Terms are only used to distinguish one component from other components. For example, a first element referred to as a first element in one embodiment can be referred to as a second element in another embodiment. The terms of a singular form may include plural forms unless referred to the contrary.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Exemplary embodiments of the invention will be described below in more detail with reference to the accompanying drawings.

Figure 2:
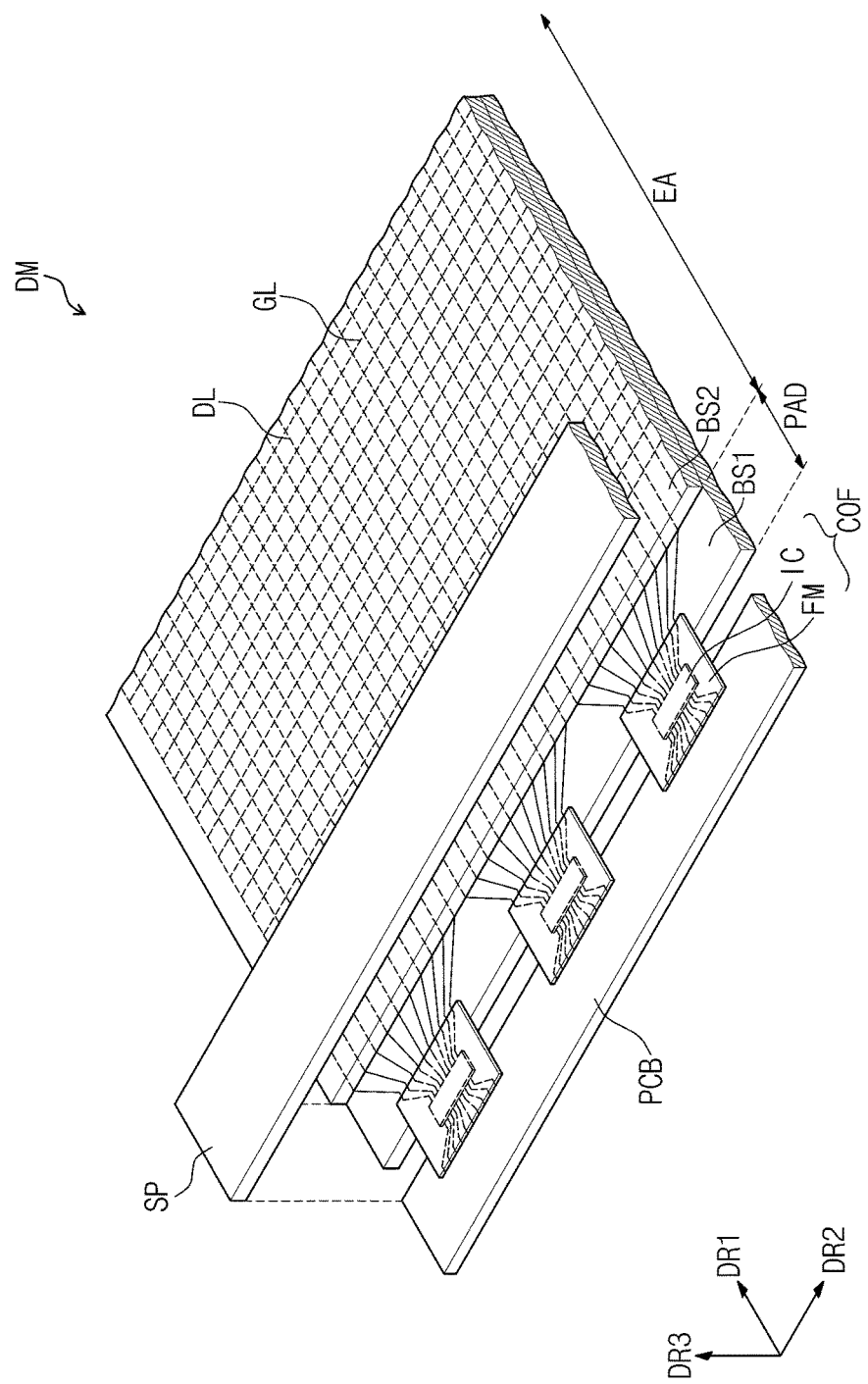
FIG. 2 is a partial exploded perspective view of an exemplary embodiment of a display module in the display apparatus of FIG. 1 according to the invention.
Figure 3:
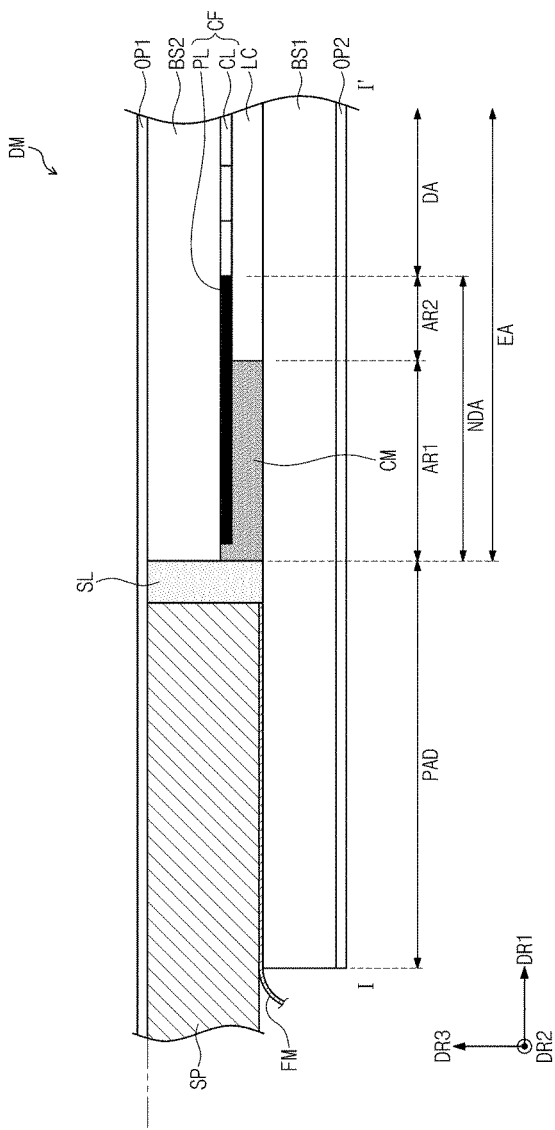
FIG. 3 is a cross-sectional view of the display module in the display apparatus, taken along line I-I' of FIG. 1.
Figure 4:
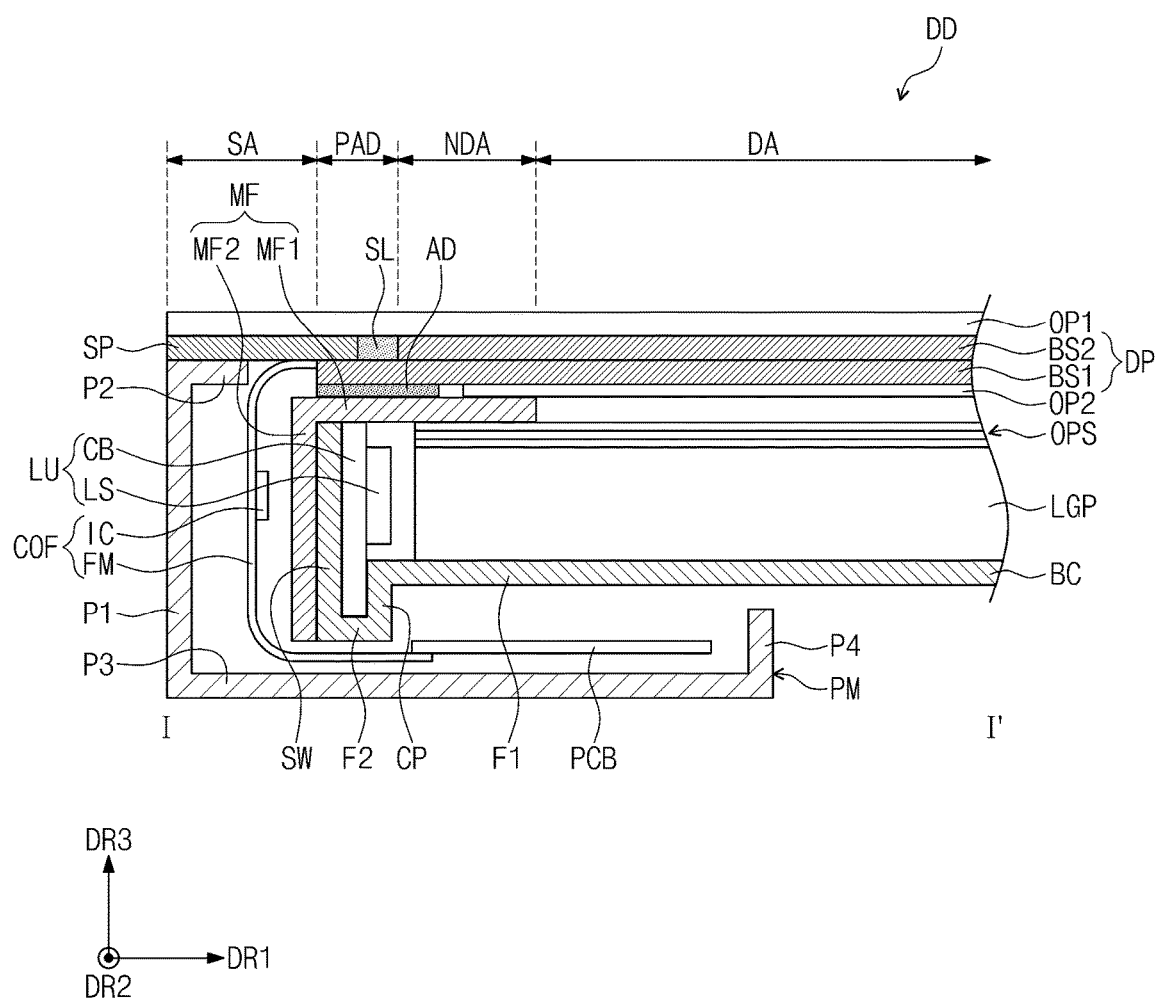
FIG. 4 is a cross-sectional view of the display apparatus, taken along line I-I' of FIG. 1.

FIG. 1 is an exploded perspective view of an exemplary embodiment of a display apparatus according to the invention, and FIG. 2 is a partial exploded perspective view of an exemplary embodiment of a display module in the display apparatus of FIG. 1 according to the invention. FIG. 3 is a cross-sectional view of the display module in the display apparatus, taken along line I-I' of FIG. 1, and FIG. 4 is a cross-sectional view of the display apparatus, taken along line I-I' of FIG. 1.

Hereinafter, referring to FIGS. 1 to 4, an exemplary embodiment of a display apparatus DD according to the invention may include a display module DM and a backlight unit BLU. Here, for convenience of description, a direction in which an image is provided from the display apparatus DD may be defined as an upward direction, and a direction opposite to the upward direction may be defined as a downward direction. However, the upward direction and the downward direction may be a relative concept, and thus be changed with respect to each other.

The display module DM may receive light from the backlight unit BLU to generate an image. The display module DM may include a display panel DP, a driving circuit connected to the display panel DP, a spacer SP, a sealant SL, and optical films OP1 and OP2.

The display panel DP may display an image with light provided from the backlight unit BLU. The display panel DP may be a non-emissive display panel, which is one of various display panels such as a liquid crystal display panel, an electrowetting display panel, an electrophoretic display panel, and a microelectromechanical system ("MEMS") display panel. However, a type of the display panel DP is not limited thereto.

In an exemplary embodiment, for example, the display panel DP may be an organic light emitting display panel or a plasma display panel. Here, since the organic light emitting display panel and the plasma display panel self-generate light to display an image, a portion of the backlight unit BLU may be omitted within the display apparatus DD. Hereinafter, the liquid crystal display panel will be described as an example for the exemplary embodiments the invention.

The display panel DP may have a rectangular plate shape having two pairs of sides that are parallel to each other. In an exemplary embodiment of the invention, the display panel DP may have a rectangular shape having a pair of relatively short sides extending lengthwise in a first direction DR1 and a pair of relatively long sides extending lengthwise in a second direction DR2 crossing the first direction DR1.

The display panel DP may include a first base substrate BS1, a second base substrate BS2 facing the first base substrate BS1, and a liquid crystal layer LC disposed between the first and second base substrates BS1 and BS2.

The first base substrate BS1 may include an effective (or active) area EA and at least one pad area PAD which is adjacent to the effective area EA. An exemplary embodiment in which the display module DM according to the invention one pad area PAD will be described. A control signal may be provided through the pad area PAD to the effective area EA.

Pixels (not shown) may be disposed or defined on the effective area EA. Each of the pixels may include at least one thin film transistor (not shown) and a pixel electrode (not shown) which is connected to the thin film transistor.

Signal lines that are respectively connected to the pixels may be disposed on the effective area EA. The signal lines may include a gate line GL and a data line DL provided in plural on the first base substrate BS1.

The gate lines GL may extend lengthwise in the second direction DR2 and may be arranged in the first direction DR1. The gate lines GL may transmit a gate voltage and/or a driving signal to a corresponding pixel among the pixels to drive the pixels. The gate voltage and/or the driving signal may be otherwise referred to as a control signal which controls the pixel.

The data lines DL may extend lengthwise in the first direction DR1 and may be arranged in the second direction DR2. The data lines DL may be disposed to be insulated from the gate lines GL. The data lines DL may transmit a data voltage and/or a driving signal to the corresponding pixel among the pixels to drive the pixels. The data voltage and/or the driving signal may be otherwise referred to as a control signal which controls the pixel.

Each of the signal lines may include or define a line portion disposed on the effective area EA and a pad portion disposed on the pad area PAD. The pad portion may be disposed on an end of the line portion. Referring to FIG. 2, for example, the line portion of the signal lines is represented by the data lines DL under the second base substrate BS2 (by dotted lines), and the pad portion of the signal lines is represented by the data lines DL extended further than a side surface of the second base substrate (by solid lines) to be disposed in the pad area PAD of the first base substrate BS1.

The second base substrate BS2 may be disposed on the first base substrate BS1. The second base substrate BS2 may be spaced apart from the first base substrate BS1 in a thickness direction DR3 (hereinafter, referred to as a third direction). The second base substrate BS2 may overlap the effective area EA of the first base substrate BS1.

The second base substrate BS2 may expose a portion the first base substrate BS1 at a side thereof to form at least one pad area PAD. In an exemplary embodiment of the invention, the second base substrate BS2 may expose the pad area PAD.

The driving circuit may include a printed circuit board PCB and a chip on film COF. The chip on film COF may include a flexible circuit film FM and a driving chip IC. The chip on film COF may be provided in plurality.

The printed circuit board PCB may be disposed adjacent to the one side of the first base substrate BS1 exposed by the second base substrate BS2. Electronic or driving devices (not shown) may be mounted on the printed circuit board PCB. The printed circuit board PCB may be connected to one side of the flexible circuit film FM. The printed circuit board PCB may be electrically connected to the pad portions of the signal lines exposed at the one side of the first base substrate BS1. A driving signal outputted from the printed circuit board PCB may be transmitted to the signal lines of the display panel DP through the flexible circuit film FM.

The driving chip IC may provide the driving signal to the signal lines. The driving chip IC may be connected to the pad portions of the signal lines of the display panel DP through the flexible circuit film FM. In an alternative exemplary embodiment, the driving chip IC may be disposed on the first base substrate BS1 and directly connected to the pad portions of the signal lines of the display panel DP.

An opposing side of the flexible circuit film FM may be connected to the pad portions of the signal lines of the display panel DP. The driving chip IC may be mounted on one surface of the flexible circuit film FM and disposed adjacent to one side of the first base substrate BS1. Electronic circuits may be mounted on the one surface of the flexible circuit film FM to electrically connect the pad portions of the signal lines of the display panel DP to other constituent elements of the display apparatus DD. In an exemplary embodiment of the invention, the driving chip IC may be mounted on a bottom surface of the flexible circuit film FM, the bottom surface facing the flexible circuit film FM and/or the first base substrate BS1.

Although not shown, the display module DM may further include a conductive adhesion member disposed between the flexible circuit film FM and the first base substrate BS1. The conductive adhesion member may bond the flexible circuit film FM to the first base substrate BS1 to electrically connect the flexible circuit film FM to the first base substrate BS1. The conductive adhesion member may be an adhesive member including a conductive ball or an anisotropic conductive film therein.

As illustrated in FIG. 3, the display panel DP may further include a color filter layer CF disposed on a bottom surface of the second base substrate BS2. The color filter layer CF may include a color pattern CL having at least one color and a colored layer PL (otherwise referred to as a "printed layer") which is adjacent to the color pattern CL. The printed layer PL may reduce or prevent a light leakage phenomenon from occurring at an edge of the second base substrate BS2.

The printed layer PL may include a material having a first color. The printed layer PL may be seen as the first color from an upper (e.g., display) side of the second base substrate BS2. The first color may be a black color. However, the invention is not limited thereto. In an exemplary embodiment, for example, the first color may be provided as various colors.

Directivity or orientation of liquid crystal molecules within the liquid crystal layer LC may be adjusted in response to electric fields formed within the display panel DP to adjust an amount of light passing through the color pattern CL, thereby providing an image.

The display panel DP may further include a coupling member CM disposed between the first base substrate BS1 and the second base substrate BS2. The coupling member CM may be disposed along the edge of the second base substrate BS2 to encapsulate the liquid crystal layer LC. Although not shown, the coupling member CM may be provided in plurality.

The coupling member CM may include or be formed of various materials. The coupling member CM may protect the liquid crystal layer LC against external moisture or contaminants. In an exemplary embodiment, for example, the coupling member CM may include a thermosetting resin or an ultraviolet ("UV") curable resin.

As illustrated in FIG. 4, the exemplary embodiment of the display module DM according to the invention may be divided into the pad area PAD, the effective area EA adjacent to one side of the pad area PAD, and a sub area SA adjacent to an opposing side of the pad area PAD.

The effective area EA may be divided into a display area DA at which an image is displayed and a non-display area NDA at which the image is not displayed. The display area DA and the non-display area NDA may together define a whole of the effective area EA.

The display area DA may be an area on which the pixels (not shown) are disposed. The display area DA may overlap the color pattern CL. The display area DA may be an area through which light provided from the backlight unit BLU is generally transmitted and at which an image is displayed.

The non-display area NDA may overlap the printed layer PL. The non-display area NDA may be divided into a first area AR1 and a second area AR2. The first area AR1 and the second area AR2 may together define a whole of the non-display area NDA. The first area AR1 may overlap or be defined by the coupling member CM. The second area AR2 may be disposed between the first area AR1 and the display area DA. The second area AR2 may be a remaining portion of the non-display area NDA except for the first area AR1. The second area AR2 may overlap a portion of the printed layer PL and a portion of the liquid crystal layer LC. In an exemplary embodiment, the second area AR2 may define or be a portion of a boundary between a bezel portion and a display portion of the display apparatus DD according to an embodiment of the invention. The bezel portion may be an edge portion of the display apparatus DD such as at an outer periphery thereof in a top plan view, and thus an image may not be displayed on or at the bezel portion. In an exemplary embodiment, for example, the bezel portion may be collectively defined by the pad area PAD, the first area AR1 and the second area AR2. A boundary may also be defined at an interface respectively between the pad area PAD, the first area AR1 and the second area AR2 within the bezel portion. The display portion of the display apparatus may be defined by the display area DA.

Referring to FIGS. 3 and 4, the spacer SP may be disposed at one side of the display panel DP. At least a portion of the spacer SP may be disposed on the pad area PAD of the first base substrate BS1. The spacer SP may face a side surface of the second base substrate BS2 and be spaced apart from the side surface of the second base substrate BS2. The spacer SP may be disposed to cover the pad portions of the signal lines. The spacer SP may be provided in plurality to respectively cover the pad portions or may be integrally or commonly provided to cover all the pad portions disposed on the pad area PAD.

The spacer SP may be disposed on the flexible circuit film FM which is on the pad area PAD. The spacer SP may remove a stepped portion that is formed between the first base substrate BS1 and the second base substrate BS2. The spacer SP may have a top surface that is coplanar with that of the second base substrate BS2.

In the top plan view, the spacer SP may have a total planar area greater than that of the pad area PAD. The spacer SP overlapping the pad area PAD may extend further than the first base substrate BS1. A remainder of the spacer SP except for the portion of the spacer SP disposed on the flexible circuit film FM or the pad area PAD may define the sub area SA of the display apparatus DD.

In an exemplary embodiment of the invention, the spacer SP may lengthwise extend in the second direction DR2 along one long side of the second base substrate BS2. A length of the spacer SP in the second direction DR2 may be substantially equal to that of the one long side of the second base substrate BS2.

The spacer SP may have the first color. The spacer SP may include or be formed of plastic or metal. Also, a body of the spacer SP may be coated or printed with a material having the first color such that the spacer SP may have the first color.

The sealant SL may be disposed between the spacer SP and the second base substrate BS2. The sealant SL may contact the spacer SP, the side surface of the second base substrate BS2 and the top surface of the first base substrate BS1. The sealant SL may include an adhesive material. Thus, the sealant SL may fix the spacer SP to the display panel DP. Although not shown, a portion of the sealant SL may be provided between the spacer SP and the first base substrate BS1 to more firmly fix the spacer SP to the display panel DP.

The sealant SL may further include a material having the first color. In an exemplary embodiment, for example, the sealant SL may include ink having the first color. That is, the printed layer PL, the spacer SP and the sealant SL have the same color as each other to mask the components thereunder such that visibility of the underlying components is reduced or effectively prevented.

The optical film OP1 and OP2 may be respectively provided on a surface of the display panel DP. The optical film OP1 and OP2 may include a first optical film OP1 provided on an upper portion of the display panel DP and a second optical film OP2 provided on a lower portion of the display panel DP.

The first optical film OP1 may extend to be disposed on the second base substrate BS2, the sealant SL and the spacer SP. The first optical film OP1 may directly contact the second base substrate BS2, the sealant SL and the spacer SP.

The second optical film OP2 may extend to be disposed on the bottom surface of the first base substrate BS1. The second optical film OP2 may overlap the display area DA and at least a portion of the non-display area NDA.

In an exemplary embodiment of the invention, each of the first and second optical films OP1 and OP2 may be, for example, a polarizing film.

Referring to FIGS. 1 and 4, the backlight unit BLU may be disposed under the display module DM. The backlight unit BLU may generate and provide light to the display panel DP. The backlight unit BLU may include a bottom chassis BC, a light guide plate LGP, a light source unit LU, an optical sheet OPS, a mold frame MF and a protection member PM.

The bottom chassis BC may be disposed under the display panel DP. The bottom chassis BC may include a bottom portion BP facing the display panel DP and a sidewall SW that is bent and extended from the bottom portion BP. The sidewall SW may extend from the bottom portion BP in the third direction DR3 to define a predetermined inner space together with the bottom portion BP.

In the top plan view, the bottom portion BP may have a rectangular shape corresponding to that of the display panel DP. The bottom portion BP may include or define a first flat portion F1, a second flat portion F2 and a connection portion CP.

The first flat portion F1 may be parallel to a plane that is defined by the first direction DR1 and the second direction DR2. The first flat portion F1 may be spaced a first distance from the first base substrate BS1 in a direction opposite to the third direction DR3.

The second flat portion F2 may be parallel to the plane that is defined by the first direction DR1 and the second direction DR2. The second flat portion F2 may be spaced a second distance that is greater than the first distance from the first base substrate BS1 in the direction opposite to the third direction DR3.

The connection portion CP may connect the first flat portion F1 to the second flat portion F2 to each other and extend to face the sidewall SW.

The light guide plate LGP may guide light incident into the light guide plate LGP to the display panel DP and be disposed between the display panel DP and the bottom portion BP. The light guide plate LGP may include or be formed of a transparent polymer resin such as polycarbonate or polymethyl methacrylate.

The light guide plate LGP may include a light incident surface, a light emission surface, side surfaces connecting the light incident surface and the light emission surface to each other, and an opposite surface. The light emission surface and the opposite surface may be the two widest surfaces of the light guide plate LGP. Light emitted from the light source unit LU is incident into the light guide plate LGP through the light incident surface. At least one side surface of the light guide plate LGP which faces the light source unit LU may define the light incident surface.

The light emission surface may be one of the two widest surfaces among surfaces of the light guide plate LGP. The light emission surface may be a planar surface facing the bottom surface of the first base substrate BS1. The light incident into the light guide plate LGP through the light incident surface may be emitted to the display panel through the light emission surface in the third direction DR3.

The opposite surface may be the other surface among the widest two surfaces of the light guide plate LGP and oppose the light emission surface. The light incident into the light incident surface may be reflected between the light emission surface and the opposite surface to travel within the light guide plate LGP.

The light source unit LU may be configured to generate and provide light and be disposed to face the light incident surface of the light guide plate LGP. The light source unit LU may include a light source LS and a circuit board CB on which the light source LS is provided.

The light source LS may be mounted on a top surface of the circuit board CB. The light source LS may be provided in plural on the top surface of the circuit board CB. The light generated and emitted from the light source LS is incident into the light guide plate LGP. The light source LS may include a point light source, a line light source or a surface light source, but is not limited thereto. In an exemplary embodiment of the invention, the light source LS in which a light emitting diode ("LED") is used as the point light source will be described as an example. The light source LS may be provided as one LED or a group of a plurality of LEDs.

A line through which power is supplied to the light source LS and which controls the power is disposed such as by being printed on the circuit board CB. The circuit board CB may include a light source control unit (not shown) connected to the light source LS. The light source control unit (not shown) may analyze an image displayed on the display panel DP to output a local dimming signal and control luminance of the light source LS in response to the local dimming signal. The light source control unit (not shown) may be mounted on a separate circuit board. Here, an exemplary embodiment of the invention is not limited to the mounted position of the light source control unit.

The light source unit LU may be fixed within the backlight unit BLU by the bottom chassis BC. The circuit board CB may be disposed on the second flat portion F2 of the bottom chassis BC. The circuit board CB may be disposed parallel to the sidewall SW of the bottom chassis BC and fixed between the sidewall SW and the connection portion CP. A thickness of the circuit board CB in the first direction DR1 may be equal to a spaced distance between the sidewall SW and the connection portion CP.

The optical sheet OPS may be disposed between the display panel DP and the light guide plate LGP. The optical sheet OPS may control light emitted from the light source LS. The optical sheet OPS may include plural individual sheets such as a diffusion sheet, a prism sheet and a protection sheet, which are stacked on the light guide plate LGP.

The diffusion sheet may diffuse the light from the light guide plate LGP. The prism sheet may collect the light diffused by the diffusion sheet in a direction perpendicular to the plane of the display panel DP that is disposed thereabove. Almost the whole light passing through the prism sheet may be incident in a direction perpendicular to the display panel DP. The protection sheet may be disposed on the prism sheet. The protection sheet may protect the prism sheet against an external impact. In the exemplary, the optical sheet OPS includes one sheet of each of the diffusion sheet, the prism sheet and the protection sheet, but is not limited thereto. In an alternative exemplary embodiment, for example, at least one of the diffusion sheet, the prism sheet and the protection sheet may be provided in plurality and then stacked to form the optical sheet OPS, or one of the diffusion sheet, the prism sheet and the protective sheet may be omitted to form the optical sheet OPS. Positions of the diffusion sheet, the prism sheet and the protection sheet within the optical sheet OPS may be variously changed in stacked position thereof.

The mold frame MF may be disposed between the display panel DP and the bottom chassis BC. The mold frame MF may be disposed under the display panel DP to support the display panel DP thereon. Also, the mold frame MF may fix positions of the optical sheet OPS and the light source unit LU within the backlight unit BLU.

The mold frame MF may have a closed ring shape with an overall rectangular shape, which extends along edges of the display panel DP. The mold frame MF may include a first frame portion MF1 and a second frame portion MF2.

At least a portion of the first frame portion MF1 may be disposed to face the bottom surface of the first base substrate BS1. The first frame portion MF1 may overlap at least a portion of the pad area PAD and at least a portion of the non-display area NDA. Also, the first frame portion MF1 may overlap at least a portion of the sub area SA. The first frame portion MF1 may be disposed on the bottom portion BP and the sidewall SW of the bottom chassis BC.

The second frame portion MF2 may be bent to extend from the first frame portion MF1 in a direction opposite to the third direction DR3. The second frame portion MF2 may be disposed to face the sidewall SW of the bottom chassis BC.

As illustrated in FIG. 4, since the flexible circuit film FM is bent at the sub area SA, at least a portion of the flexible circuit film FM may face the second frame portion MF2. Also, the flexible circuit film FM may be bent and face the bottom portion BP of the bottom chassis BC. As a result, the printed circuit board PCB attached to the flexible circuit film FM may be disposed under the bottom chassis BC to face the bottom surface BP of the bottom chassis BC. In an exemplary embodiment of the invention, the printed circuit board PCB may face the first flat portion F1 of the bottom portion BP, but is not limited thereto.

The protection member PM may protect the chip on film COF and the printed circuit board PCB exposed outside the display module DM. The protection member PM may include or define a first protection portion P1, a second protection portion P2, a third protection portion P3 and a fourth protection portion P4.

The first protection portion P1 may face the sidewall SW with the chip on film COF therebetween. The first protection portion P1 may be disposed on the sub area SA to overlap a distal end of the spacer SP.

The second protection portion P2 may be bent and extended from an end of the first protection portion P1 to support the distal end portion of the spacer SP thereon. The second protection portion P2 may face a bottom surface of the spacer SP.

The third protection portion P3 may be bent and extended from an opposing end of the first protection portion P1 to face the bottom portion BP with the printed circuit board PCB therebetween.

The fourth protection portion P4 may be bent and extended from the third protection portion P3 to face the connection portion CP.

The printed circuit board PCB may be disposed in a predetermined space that is defined by the third protection portion P3, the fourth protection portion P4, the first flat portion F1 and the connection portion CP.

The exemplary embodiment of the display apparatus DD according to the invention may further include an adhesion member AD for fixing the display panel DP to the mold frame MF. The adhesion member AD may be disposed between the bottom surface of the first base substrate BS1 and the first frame portion MF1 of the mold frame MF. The adhesion member AD may overlap the pad area PAD and the non-display area NDA. The adhesion member AD may be provided as a double-sided tape or an adhesion resin.

The exemplary embodiment of the display apparatus DD according to the invention may include the spacer SP and the sealant SL, which have the same color as the printed layer PL, to reduce or effectively prevent a boundary between the spacer SP and the base substrate BS2 from being seen outside the display apparatus DD. Also, the spacer SP may compensate the stepped portion between the first base substrate BS1 and the second base substrate BS2 to realize the slim display apparatus DD without using a separate chassis member.

Hereinafter, another exemplary embodiment of a display apparatus according to the invention will be described with reference to FIGS. 5 and 6. For convenience of description, the differences between the display apparatus in FIGS. 5 and 6 and the foregoing exemplary embodiment will be mainly described, and omitted descriptions will be derived from the foregoing exemplary embodiment. Also, the same reference symbol is given to the same components, and duplicated descriptions with respect to the components will be omitted.

Figure 5:
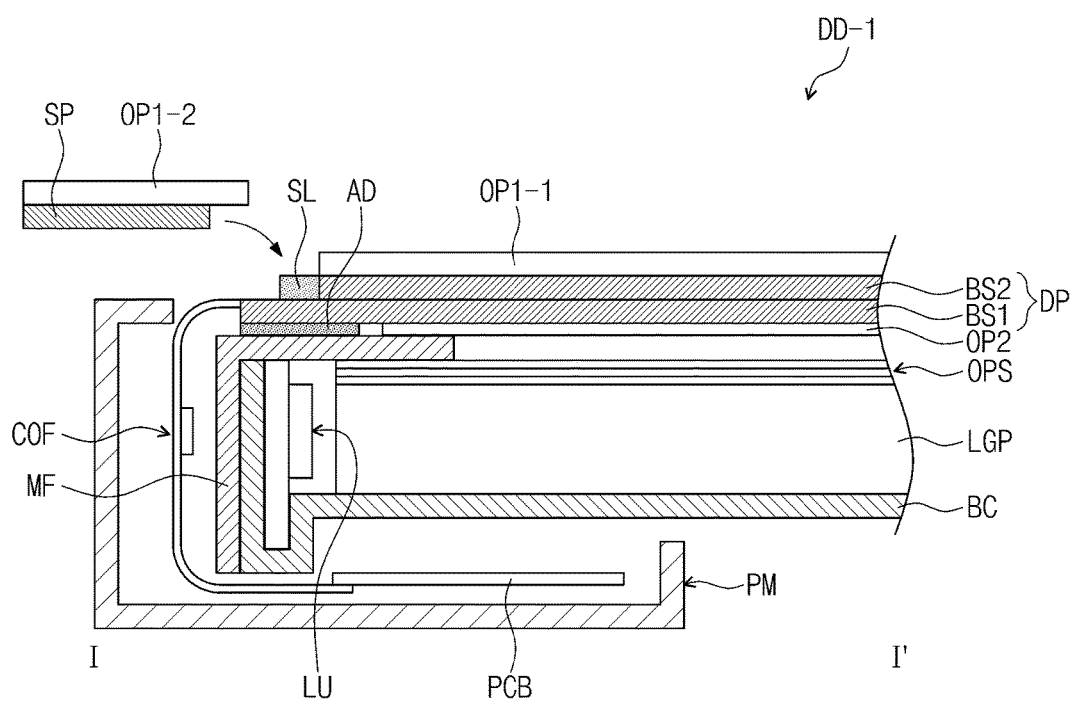
FIGS. 5 and 6 are partial cross-sectional views of another exemplary embodiment of a display apparatus according to the invention.
Figure 5:
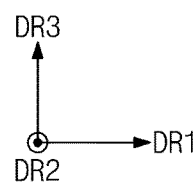
Figure 6:
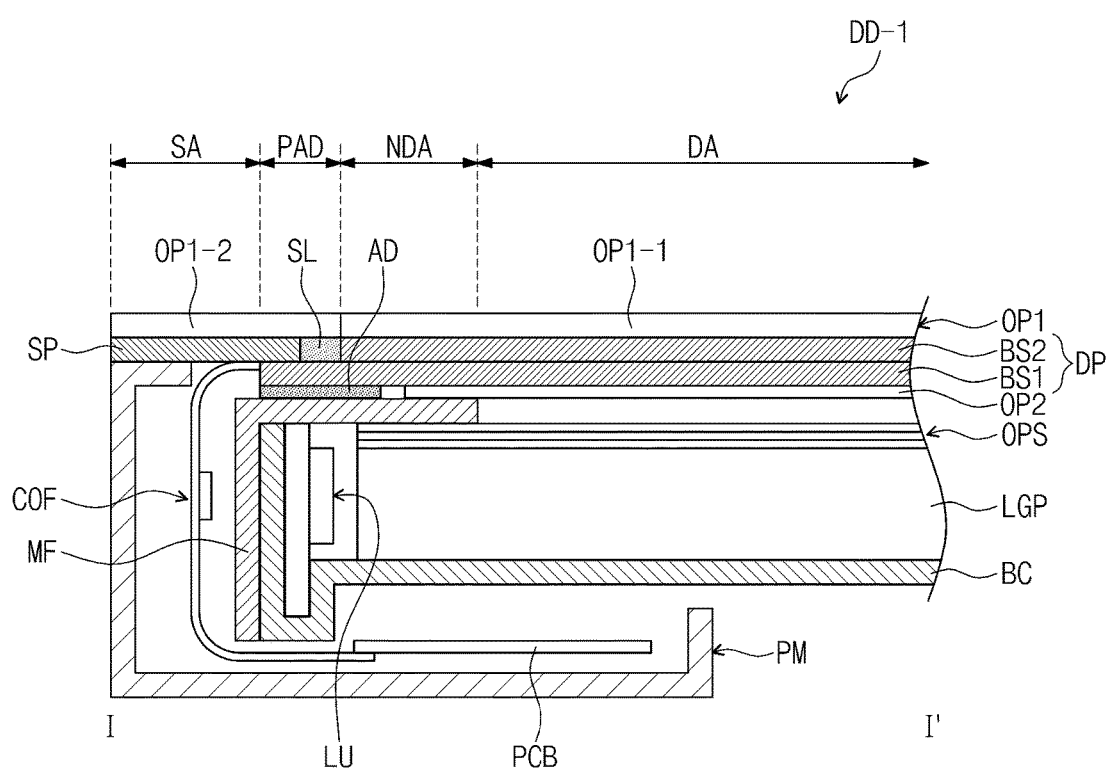

FIGS. 5 and 6 are partially cross-sectional view of another exemplary embodiment of a display apparatus according to the invention. FIG. 5 is an exploded view of a portion of a display apparatus DD-1 according to the invention, and FIG. 6 is a view of an assembled state of the display apparatus DD-1.

Referring to FIGS. 5 and 6, the display apparatus DD-1 may include a first optical film OP1 disposed on a display panel DP. The first optical film OP1 may include a first film portion OP1-1 and a second film portion OP1-2.

Although the first optical film OP1 (see FIG. 4) in which the first film portion OP1-1 and the second film portion OP-2 are integrated with each other to form a single unitary member OP1 is illustrated, the first film portion OP-1 and the second film portion OP1-2 may be separate members from each other in another embodiment of the invention.

The first film portion OP1-1 may overlap the second base substrate BS2. The first film portion OP1-1 may overlap the display area DA and the non-display area NDA. In the top plan view, the first film portion OP1-1 may have substantially the same area as that of the second base substrate BS2.

The second film portion OP1-2 may overlap a spacer SP and a sealant SL. The second film portion OP1-2 may overlap a sub area SA and a pad area PAD. The second film portion OP1-2 may be attached to a top surface of the spacer SP in an un-assembled state of the display apparatus DD-1 to be integrally with the spacer SP in the-assembled state of the display apparatus DD-1. Thus, in a method of manufacturing the display apparatus DD-1 the spacer SP and the second film portion OP1-2 may be coupled to the display panel DP after the sealant SL is applied on the first base substrate BS1. In the top plan view, the second film portion OP1-2 may have substantially the same area as a total of that of the spacer SP and the sealant SL. The second film portion OP1-2 may not overlap the second base substrate BS2 in the top plan view. The first film portion OP1-1 and a second film portion OP1-2 may define a whole of the optical film OP1 in the display apparatus DD-1.

Figure 7:
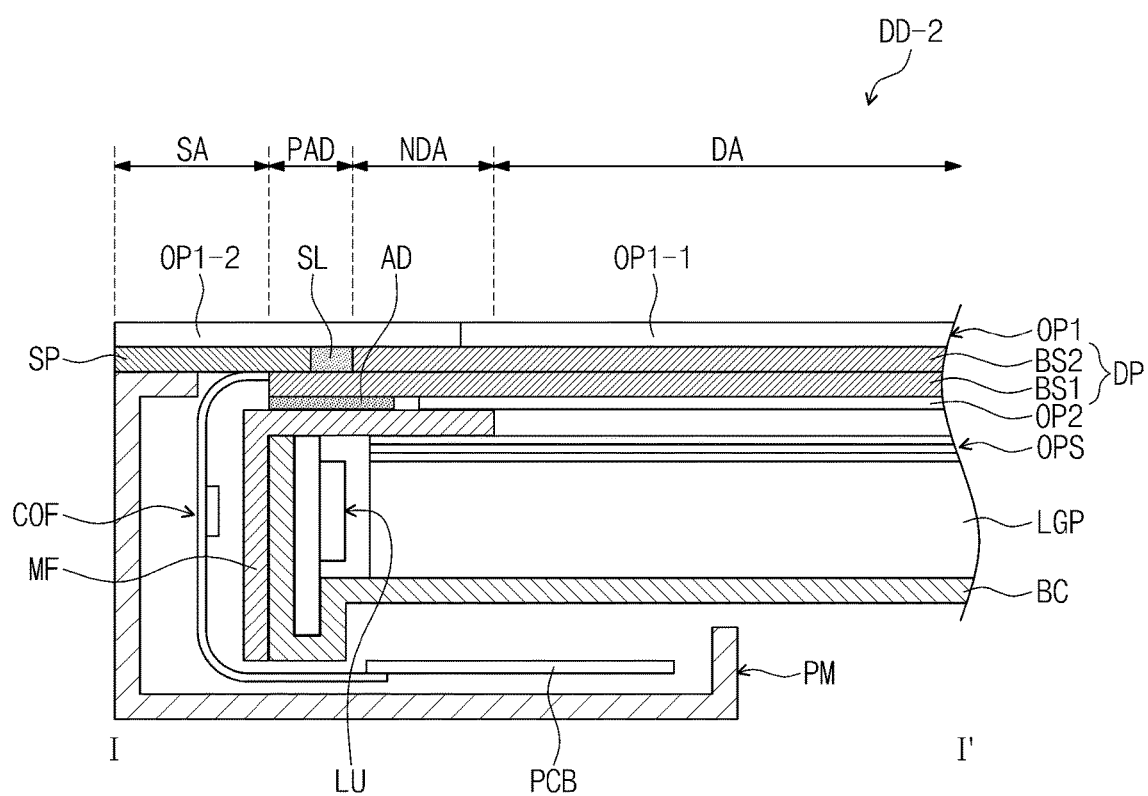
FIG. 7 is a partial cross-sectional view of still another exemplary embodiment of a display apparatus according to the invention.

FIG. 7 is a partial cross-sectional view of still another exemplary embodiment of a display apparatus according to the invention.

Referring to FIG. 7, an exemplary embodiment of a display apparatus DD-2 according to the invention may include a first optical film OP1 disposed on a display panel DP. The first optical film OP1 may include or be defined by a first film portion OP1-1 and a second film portion OP1-2.

The first film portion OP1-1 may overlap the second base substrate BS2. The first film portion OP1-1 may overlap a display area DA and a portion of a non-display area NDA. In the top plan view, the first film portion OP1-1 may have an area that is less than that of the second base substrate BS2.

The second film portion OP1-2 may overlap a spacer SP, a sealant SL and a portion of the second base substrate BS2. The second film portion OP1-2 may overlap a sub area SA, a pad area PAD, and a remaining portion of the non-display area NDA. In the top plan view, the second film portion OP1-2 may have an area that is greater than that of the spacer SP and the sealant SL. The second film portion OP1-2 on the spacer SP and the sealant SL may extend further therefrom to overlap the second base substrate BS2 in the top plan view.

As described above, each of the first film portion OP1-1 and the second film portion OP1-2 may be variously changed in size according to a process and/or design of the display apparatus product.

Figure 8:
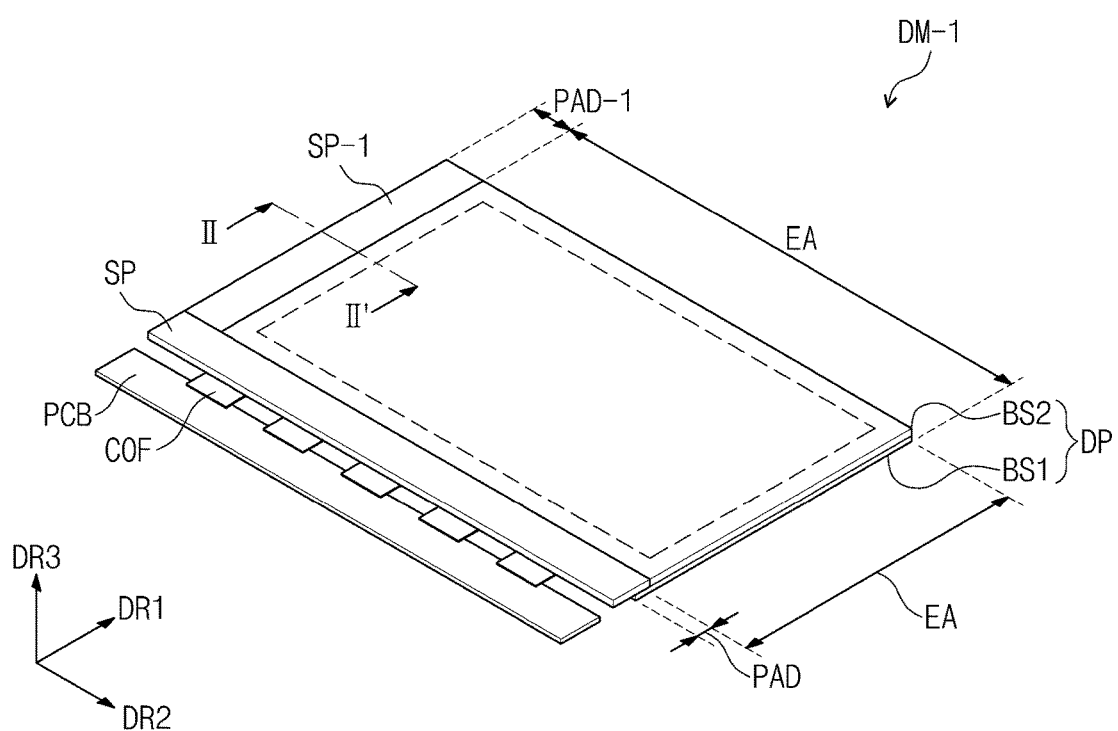
FIG. 8 is a perspective view of another exemplary embodiment of a display module according to the invention.
Figure 9:
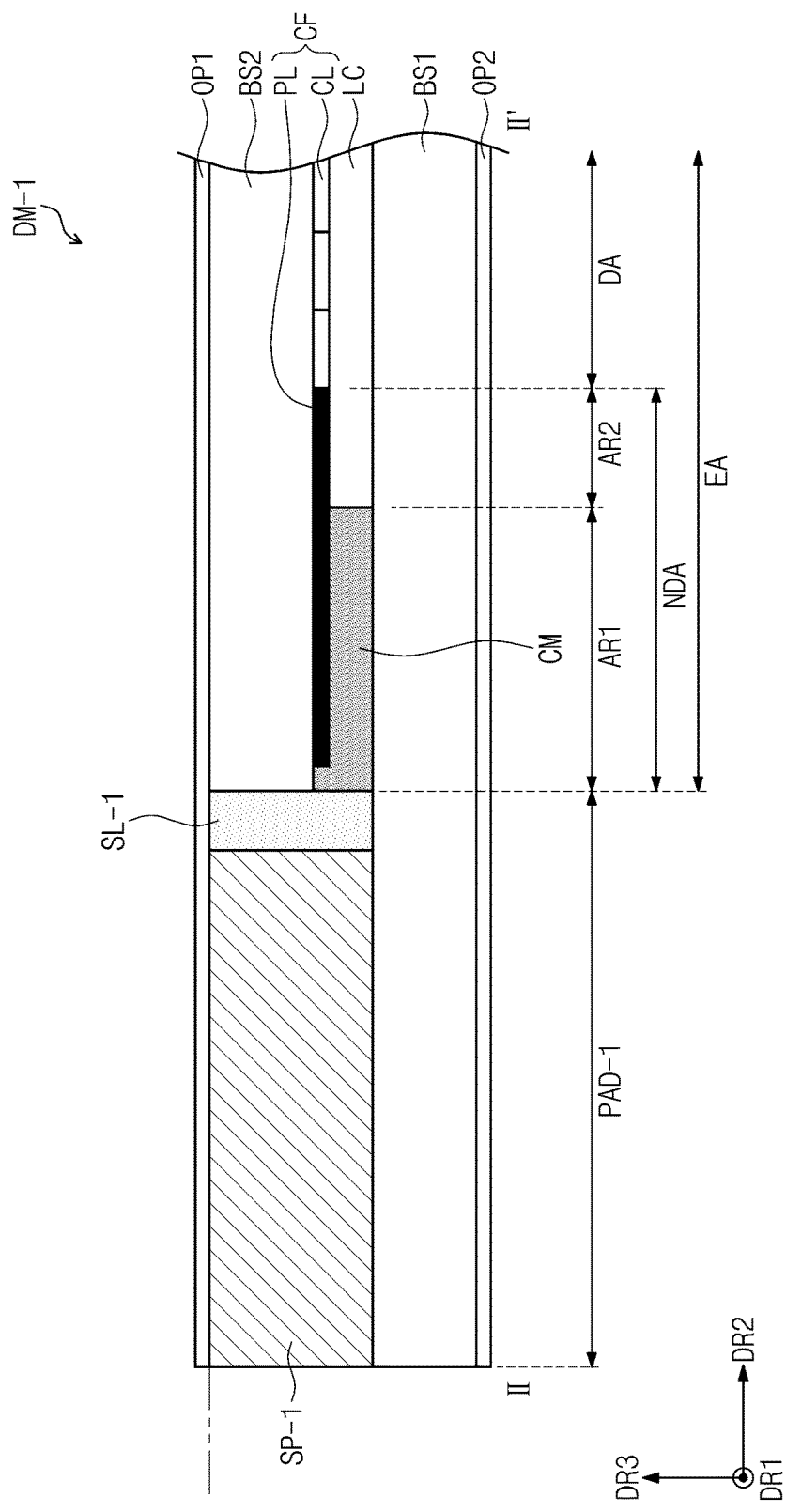
FIG. 9 is a cross-sectional view of the display module, taken along line II-II' of FIG. 8.

FIG. 8 is a perspective view of another exemplary embodiment of a display module according to the invention, and FIG. 9 is a cross-sectional view of the display module, taken along line II-II' of FIG. 8.

Referring to FIGS. 8 and 9, an exemplary embodiment of a display module DM-1 according to the invention may include a plurality of pad areas. The display module DM-1 may include a pad area PAD and a sub pad area PAD-1. The pad area PAD and the sub pad area PAD-1 may be respectively disposed at each of two edges, which are adjacent to each other, among edges of an effective area EA. However, the invention is not limited thereto. In an exemplary embodiment, for example, each of the pad area PAD and the sub pad area PAD-1 may be changed in position according to positions of the pad portions of the signal lines of the display panel within the display module DM-1. A control signal may be provided through each of the pad area PAD and the sub pad area PAD-1 to the effective area EA.

The display module DM-1 may include a sub spacer SP-1, a sub sealant SL-1 and a first optical film OP1.

The sub spacer SP-1 may face a side surface of a second base substrate BS2 and be spaced apart from the side surface of the second base substrate BS2. The sub spacer SP-1 may be disposed to cover the pad portions of the signal lines disposed on the sub pad area PAD-1 of a display panel DP. The sub spacer SP-1 may be provided in plurality to respectively cover the pad portions or may be integrally or commonly provided to cover all the pad portions disposed on the sub pad area PAD-1 of the display panel DP.

The sub spacer SP-1 may remove a stepped portion that is formed between a first base substrate BS1 and a second base substrate BS2 of the display panel DP. The sub spacer SP-1 may have a top surface that is coplanar with that of the second base substrate BS2. In the top plan view, the sub spacer SP-1 may have substantially the same total planar area as that of the sub pad area PAD-1.

The sub spacer SP-1 may have a first color. The sub spacer SP-1 may include or be formed of plastic or metal. Also, a body of the sub spacer SP-1 may be coated or printed with a material having the first color such that the spacer may have the first color.

The sub sealant SL-1 may be disposed between the sub spacer SP-1 and the second base substrate BS2. The sub sealant SL-1 may contact the sub spacer SP-1, a side surface of the second base substrate BS2, and a top surface of the first base substrate BS1. The sub sealant SL-1 may include an adhesive material. Thus, the sub sealant SL-1 may fix the sub spacer SP-1 to the display panel DP. Although not shown, a portion of the sub sealant SL-1 may be provided between the sub spacer SP-1 and the first base substrate BS1 to more firmly fix the sub spacer SP-1 to the display panel DP.

The sub sealant SL-1 may further include a material having the first color. For example, the sub sealant SL-1 may include ink having the first color.

A first optical film OP1 may be disposed on the second base substrate BS2, the sealant SL (see FIG. 3), the sub sealant SL-1, the spacer SP (see FIG. 3) and the sub spacer SP-1. The first optical film OP1 may directly contact the second base substrate BS2, the sealant SL, the sub sealant SL-1, the spacer SP and the sub spacer SP-1.

The exemplary embodiment of the display module DM-1 of a display apparatus according to the invention may include the spacer and the sealant, which have the same color as the printed layer, to reduce or effectively prevent the boundary between the spacer and the second base substrate from being seen, thereby improving the display quality of the display apparatus product. Also, the display apparatus having the slim design may be provided without using a separate chassis member.

It will be apparent to those skilled in the art that various modifications and variations can be made in the invention. Thus, it is intended that the invention covers the modifications and variations of this invention provided they come within the scope of the appended claims and their equivalents.

Hence, the real protective scope of the invention shall be determined by the technical scope of the accompanying claims.

What is claimed is:

1. A display apparatus comprising:
a first base substrate comprising an effective area in which an image is displayed and a pad area which is adjacent to a side of the effective area and through which a control signal is provided to the effective area;
a second base substrate disposed on the first base substrate to overlap the effective area and expose the pad area of the first base substrate;
a spacer disposed on the exposed pad area of the first base substrate and facing a side surface of the second base substrate, the spacer being spaced apart from the side surface of the second base substrate;
a sealant disposed between the spacer on the exposed pad area of the first base substrate and the side surface of the second base substrate to contact both the spacer and the side surface of the second base substrate; and
an optical film disposed on the second base substrate, the sealant, and the spacer.

2. The display apparatus of claim 1, wherein, in a top plan view, the spacer has a planar area greater than that of the pad area.

3. The display apparatus of claim 2, further comprising a colored layer overlapping the effective area, the colored layer being disposed on a portion of a bottom surface of the second base substrate facing the first base substrate,
wherein the colored layer comprises a material having a first color.

4. The display apparatus of claim 3, wherein the spacer has the first color of the colored layer.

5. The display apparatus of claim 4, wherein, in the top plan view, the spacer is lengthwise disposed along the side surface of the second base substrate.

6. The display apparatus of claim 3, wherein the sealant comprises a material having the first color of the colored layer.

7. The display apparatus of claim 3, further comprising signal lines through which the control signal is transmitted into the effective area, the signal lines comprising a line portion disposed on the effective area and a pad portion disposed on the pad area,
wherein the spacer is disposed on the pad portion of the signal lines.

8. The display apparatus of claim 7, further comprising:
a flexible circuit film which is connected to the pad portion of the signal lines, is disposed in the pad area of the first base substrate and which provides the control signal to the pad portion;
a driving chip which is mounted on the flexible circuit film and provides the control signal to the flexible circuit film; and
a printed circuit board which is connected to the flexible circuit film and generates the control signal,
wherein the spacer is disposed on the flexible circuit film in the pad area of the first base substrate.

9. The display apparatus of claim 8, further comprising a backlight unit which is disposed under the first base substrate and provides light to the first base substrate,
wherein the backlight unit comprises:
a bottom chassis defining a bottom portion thereof facing the first base substrate, the bottom portion extended to define a bent portion thereof which defines a sidewall of the bottom chassis;
a mold frame defining a first frame portion thereof facing the bottom portion of the bottom chassis to overlap the sidewall of the bottom chassis, the first frame portion extended to define a bent portion thereof which defines a second frame portion of the mold frame, the second frame portion facing the sidewall of the bottom chassis;
a light source unit which is in the bottom chassis and generates the light; and
a light guide plate disposed between the bottom chassis and the mold frame.

10. The display apparatus of claim 9, wherein
a plane of the first base substrate is defined by a first direction and a second direction which crosses the first direction, and a thickness direction of the first base substrate is defined in a third direction crossing both the first and second directions, and
the bottom portion of the bottom chassis defines:
a first flat portion thereof spaced a first distance from the first base substrate in the third direction;
a second flat portion thereof spaced a second distance from the first base substrate in the third direction greater than the first distance in the third direction; and
a connection portion thereof which connects the first flat portion to the second flat portion, the connection portion facing the sidewall of the bottom chassis.

11. The display apparatus of claim 10, wherein the light source unit comprises:
a circuit board disposed between the sidewall and the connection portion, and on the second flat portion of the bottom chassis; and
a light source which is mounted on the circuit board and generates and emits the light to the light guide plate.

12. The display apparatus of claim 11, wherein the flexible circuit film disposed in the pad area of the first base substrate is extended bent from the first base substrate to face the second frame portion of the mold frame and the bottom portion of the bottom chassis.

13. The display apparatus of claim 12, wherein the printed circuit board connected to the flexible circuit film extended bent from the first base substrate is disposed under the bottom chassis to overlap the first flat portion thereof.

14. The display apparatus of claim 13, further comprising a protection member which is disposed outside the flexible circuit film extended bent from the first base substrate and defines:
a first protection portion facing the sidewall of the bottom chassis with the flexible circuit film therebetween;
the first protection portion extended at a first end thereof to define a bent portion thereof which defines a second protection portion of the protection member on which the spacer is supported;
the first protection portion extended from an opposing second end thereof to define a bent portion thereof which defines a third protection portion facing the bottom portion of the bottom chassis with the printed circuit board therebetween; and
the third protection portion extended to define a bent portion thereof which defines a fourth protection portion bent facing the connection portion of the bottom chassis with the printed circuit board therebetween.

15. The display apparatus of claim 1, wherein the optical film defines:
a first film portion overlapping the second base substrate; and
a second film portion of which at least a portion overlaps the sealant and the spacer.

16. The display apparatus of claim 15, wherein the first film portion overlapping the second base substrate extends further than the second base substrate to define the second film portion.

17. The display apparatus of claim 15, wherein
the first film portion and the second film portion are separate members from each other, and
in a top plan view, the second film portion has a same planar area as a total of that of the spacer and the sealant.

18. The display apparatus of claim 15, wherein
the first film portion and the second film portion are separate members from each other, the first film portion overlaps a portion of the effective area, and the second film portion overlaps a remaining portion of the effective area not overlapped by the first film portion, and in a top plan view, the second film portion has a planar area greater than a total of that of the spacer and the sealant.

19. A display apparatus comprising:
a first base substrate comprising:
an effective area comprising a display area in which an image is displayed, and a non-display area in which the image is not displayed,
a pad area which is adjacent to a first edge of the effective area and through which a control signal is provided to the effective area, and
a sub pad area which is adjacent to a second edge of the effective area adjacent to the first edge thereof and through which the control signal is provided to the effective area;
a second base substrate disposed on the first base substrate to overlap the effective area and respectively expose the pad area and the sub pad area of the first base substrate;
a colored layer overlapping the non-display area and disposed on a bottom surface of the second base substrate, the colored layer comprising a material having a first color;
a spacer disposed on the exposed pad area of the first base substrate and spaced apart from the first side surface of the second base substrate, the spacer having the first color;
a sub spacer disposed on the exposed sub pad area of the first base substrate and spaced apart from the second side surface of the second base substrate, the sub spacer having the first color;
a sealant disposed between the spacer on the exposed pad area of the first base substrate and the first side surface of the second base substrate, the sealant having the first color;
a sub sealant disposed between the sub spacer on the exposed sub pad area of the first base substrate and the second side surface of the second base substrate, the sub sealant having the first color; and
an optical film disposed on the second base substrate, the sealant, the sub sealant, the spacer, and the sub spacer.

20. The display apparatus of claim 19, wherein, in a top plan view,
the spacer has planar area greater than that of the pad area, and
the sub spacer has a planar area same as that of the sub pad area.

* * * * *